United States Patent [19]

Eklund et al.

[11] Patent Number: 4,958,213
[45] Date of Patent: Sep. 18, 1990

[54] METHOD FOR FORMING A TRANSISTOR BASE REGION UNDER THICK OXIDE

[75] Inventors: Robert H. Eklund, Plano; Robert H. Havemann, Garland, both of Tex.

[73] Assignee: Texas Instruments Incorporated, Dallas, Tex.

[21] Appl. No.: 366,224

[22] Filed: Jun. 12, 1989

Related U.S. Application Data

[63] Continuation of Ser. No. 129,271, Dec. 7, 1987, abandoned.

[51] Int. Cl.⁵ .................. H01L 29/04; H01L 27/02
[52] U.S. Cl. .................................. 357/59; 357/43; 357/51
[58] Field of Search .............................. 357/43, 51, 59

[56] References Cited

U.S. PATENT DOCUMENTS

| | | | |
|---|---|---|---|
| 4,503,603 | 3/1985 | Blossfeld | 357/43 |
| 4,529,456 | 7/1985 | Anzai et al. | 357/43 |
| 4,616,405 | 10/1986 | Yasuoka . | |
| 4,637,125 | 1/1987 | Iwasaki et al. . | |
| 4,678,936 | 7/1987 | Holloway | 357/43 |
| 4,710,791 | 12/1987 | Shirato et al. | 357/51 |
| 4,737,472 | 4/1988 | Schaber et al. | 357/43 |
| 4,752,589 | 6/1988 | Schaber | 357/43 |

FOREIGN PATENT DOCUMENTS

| | | |
|---|---|---|
| 0097379 | 1/1984 | European Pat. Off. . |
| 0151347 | 8/1985 | European Pat. Off. . |
| 021583 | 3/1987 | European Pat. Off. . |

Primary Examiner—Rolf Hille
Assistant Examiner—Wael Fahmy
Attorney, Agent, or Firm—Richard A. Stoltz; James T. Comfort; Melvin Sharp

[57] ABSTRACT

A process for fabricating an integrated circuit with both bipolar and CMOS transistors is disclosed. Buried n-type and p-type layers are diffused into a substrate, and a substantially intrinsic epitaxial layer is formed above the buried layers. N-wells and p-wells are formed into the epitaxial layer self-aligned relative to one another, over their respective buried layers. The intrinsic epitaxial layer allows the formation of the p-well, into which n-channel MOS transistors are eventually formed, with minimal mobility degradation due to counterdoping. Isolation oxide regions are formed at the boundaries of the wells, for isolation of the wells relative to one another. Trench isolation may alternatively be used, such trenches including polysilicon plugs which are recessed into the trench, and filled with an oxide layer to allow the placement of contacts over the trench with minimal overetch-induced or stress-induced leakage.

11 Claims, 9 Drawing Sheets

METHOD FOR FORMING A TRANSISTOR BASE REGION UNDER THICK OXIDE

This application is related to applications Ser. No. 129,261 (TI-13151) and Ser. No. 129,270 (TI-12481), filed contemporaneously herewith.

This invention is in the field of integrated circuits, and is specifically directed to methods of fabricating bipolar and CMOS transistors in the same integrated circuit.

BACKGROUND OF THE INVENTION

As is well known in the art, digital and linear functions are often performed by integrated circuits using either bipolar or metal-oxide-semiconductor (MOS) technology. Bipolar integrated circuits, of course, provide higher speed operation and greater drive currents than the MOS circuits, at the cost of higher power dissipation, especially when compared against complementary MOS (CMOS) circuits. Recent advantages in manufacturing technology have allowed the use of both bipolar and CMOS transistors in the same integrated circuit (commonly referred to as BiCMOS devices). An example of a BiCMOS structure is described in copending application Ser. No. 008,910, filed Jan. 30, 1987 and assigned to Texas Instruments Incorporated.

The formation of BiCMOS devices may of course be accomplished by forming the bipolar transistors according to known techniques in selected areas of the device, by forming the MOS transistors according to known techniques in selected areas of the device, and interconnecting the two types of transistors. However, certain features of each type of transistor tend to be incompatible, from a process standpoint, with the other type, requiring a large number of process steps to form each. It is therefore preferable in the manufacture of such BiCMOS circuits to utilize structures which are useful in both types of transistors, in order to minimize the process complexity and cost. Such dual utilization of structural components and process steps, however, generally results in a process which is less than optimal for either the bipolar or the MOS transistors, or both.

Prior methods for forming the bipolar transistors in such structures, such as described in said application Ser. No. 008,910, have incorporated thin oxide layers between the diffused base region and the overlying emitter electrode (generally formed of polysilicon). The thin oxide over the base is generally formed in the same step as the gate oxide for the MOS transistors, and therefore is generally of a thickness on the order of 20 nm.

Such thin oxides separating the base region from the emitter electrode cause certain problems, however. Firstly, performance of the bipolar transistors degrades as the emitter-to-base capacitance increases. Of course, such capacitance increases as the dielectric thickness therebetween decreases, making it preferable to have a thicker dielectric between the emitter and the base region. In addition, a thin dielectric between the emitter electrode and the base region is inherently weaker to stress from subsequent processing steps such as contact etch, silicidation, and metal deposition and sinter. Furthermore, a thin dielectric also increases the risk that a contact via formed over the oxide for connecting an overlying metallization layer to the emitter electrode will leak to the base region. This can occur in the event that the contact via is overetched through the emitter electrode, in which case the dielectric under the emitter electrode will be further thinned, in turn further increasing the emitter-to-base capacitance. In extreme cases, the dielectric may be etched completely through, shorting the overlying metal and the emitter electrode to the base region.

The method described in the above-referenced application Ser. No. 008,910, using the thin MOS gate oxide thin dielectric over the base region, avoids the stress and overetch problems by making contact to the polysilicon emitter electrode at a location away from the contact to the base region. Such a configuration does not address the emitter-to-base capacitance problem, and adds the disadvantage of increasing the emitter resistance.

It is therefore an object of this inventio to provide a process for forming a BiCMOS structure which incorporates a substantially thicker dielectric layer between the base and emitter of the bipolar transistors.

It is yet another object of this invention to provide such a process which provides such a thicker dielectric in a manner compatible with the formation of the MOS transistors in the same structure, and without requiring an additional masking step to form the thicker oxide over the base region.

It is yet another object of this invention to provide such a process which can be used to form diffused resistors as well as the bipolar transistor base region.

Other objects and advantages of the invention will be apparent to those of ordinary skill in the art having reference to the following specification in conjunction with the drawings.

SUMMARY OF THE INVENTION

The invention may be incorporated into a method for fabricating a semiconductor device, by defining the base region of a bipolar transistor with a masking layer covering the portions of the surface other than the base region. The masking layer contains silicon nitride, for prevention of oxidation. A relatively thick oxide layer is then grown over the intended base region, and the base dopant is implanted therethrough; the masking layer must also be sufficiently thick to block the base implant. After implant of the base region, the masking layer may be removed, and the emitter region may be formed by way of polysilicon autodoping, or by another implant. The same process may be used to form diffused resistors, with a polysilicon layer used to define the resistor, and with a more heavily doped diffusion at each end of the diffused region for making contact to the resistor. The polysilicon also serves to block the siliciding of the resistor.

DETAILED DESCRIPTION OF THE PREFERRED EMBODIMENT

Figure 1:
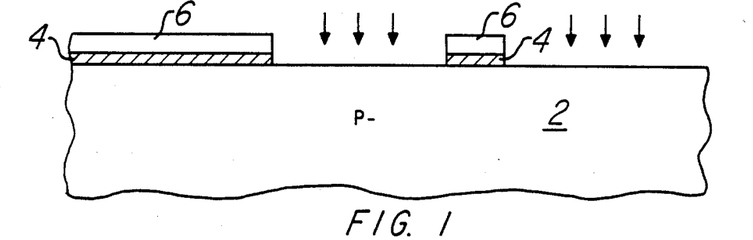
FIGS. 1 through 6, FIGS. 8 through 14, and FIGS. 16 and 17 are cross-sectional views of a BiCMOS semiconductor structure in various states of fabrication, according to the process of the invention.

FIG. 1 is a cross-sectional view of a lightly doped p-type single crystal silicon substrate 2 in wafer form, shown prior to the formation of a buried n-type layer. A masking layer consisting of silicon oxide layer 4 covered by silicon nitride layer 6 is formed according to any one of a number of well-known techniques; for example, silicon oxide layer 4 may be a grown oxide having a nominal thickness of 50 nm, and nitride layer may be a deposited by low pressure chemical vapor deposition (LPCVD) to nominally 100 nm thick. Layers 4 and 6 are patterned as shown in FIG. 1, and serve as a mask for the implant of the buried n+ region, such an implant indicated by the arrows of FIG. 1. The photoresist (not shown) used for the patterning of masking layers 4 and 6 is preferably removed prior to the heavy-dose buried n+ ion implantation. An example of an implant for forming the buried n+ region in this embodiment is an antimony implant at an energy on the order of 40 keV with a dose on the order of 5E15 ions/cm$^2$.

After the implant step, the diffusion of the antimony to form buried n+ region 8 occurs during a high temperature anneal, such as at 1250 degrees Celsius for 30 minutes, as is typically required for antimony diffusion. The resultant depth of buried n+ region 8 is in the range of 2 to 3 microns. Of course other dopants such as arsenic may be used to form buried n+ region 8, which may be driven with a lower temperature anneal (e.g., 1000 degrees Celsius for arsenic). Thick oxide regions 10 are also formed during this step in the locations not covered by nitride layer 6, to a thickness of between 250 and 300 nm. The masking nitride layer 6 is then stripped after the anneal.

Figure 2:
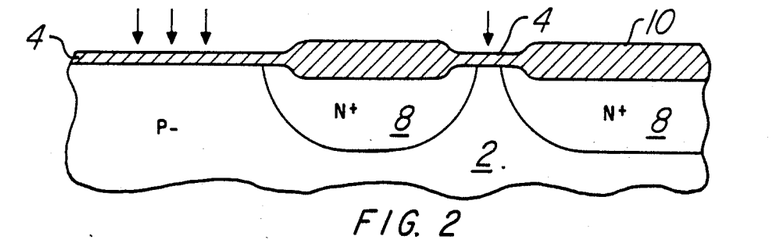

Thick oxide regions 10 of FIG. 2 serve as a mask to the ion implant for forming buried p-type regions. Accordingly, a boron implant (indicated in FIG. 2 by the arrows) is performed, for example at an energy in the range of 40 to 70 keV with a dose in the range of 5E12 to 2E13 ions/cm$^2$. An anneal step is then performed to drive the implanted boron, such an anneal being done at a temperature of 900 to 950 degrees Celsius for a period of from 30 to 60 minutes, depending upon the depth desired; in this embodiment, the depth of buried p region 12 is approximately 1 micron. It should be noted that the provision of buried p-regions by this implant is not essential in fabricating an operable device, as a p-type substrate 2 of sufficient doping concentration to prevent punch-through between adjacent buried n+ regions 8 could alternatively be used, without the need for a buried p-type region. Omission of the buried p-type regions also would allow the use of a thick oxide layer as the n+ implant mask, rather than the nitride/oxide sandwich of layers 4 and 6 described above.

In addition, it should be noted that the use of thick oxide layers 10 to mask the boron implant results in a buried p-type region which is adjacent to and self-aligned with buried n+ region 8, without requiring another mask and pattern step. Of course, such an additional mask and pattern step prior to the boron implant may alternatively be used if a space between the eventual p-type buried region and buried n+ region 8 is desired.

Figure 3:
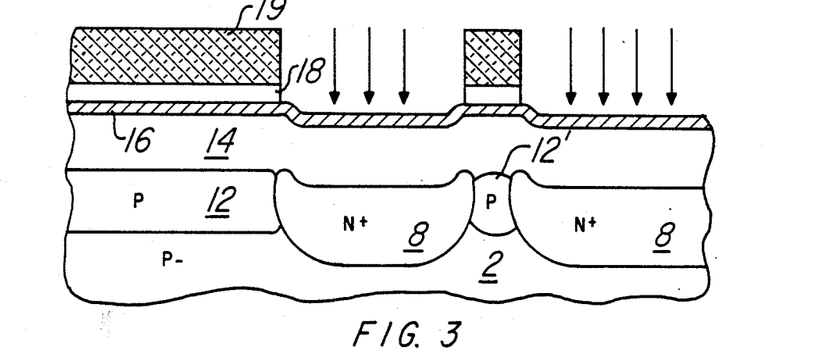

FIG. 3 illustrates buried p-type region 12 formed adjacent to buried n+ region 8; p-type region portion 12' lying in a narrow space between adjacent buried n+ regions 8 is not of sufficient size to eventually include a p-well, but will serve instead as an isolation region between the adjacent buried n+ regions 8. Subsequent to the boron implant described above, thick oxide layer 10 (as well as oxide 4) is stripped, and epitaxial layer 14 is grown according to well known techniques. Epitaxial layer 14 in this embodiment of the invention is very lightly doped n-type material (i.e., greater than 10 ohm-cm), so as to be substantially intrinsic silicon. As will be described below, epitaxial layer 14 will be selectively implanted to form p-type and n-type wells into which both the MOS and bipolar transistors will be formed. For the benefit of the bipolar transistors, epitaxial layer 14 is kept relatively thin (for example, on the order of 0.75 to 1.50 microns) so that the length of the portion of the collector which is in the n-well (between a diffused base region and buried n+ region 8) is minimized, reducing the collector resistance.

A thin layer (e.g., ~35 nm) of oxide 16 is grown on the surface of epitaxial layer 14, followed by LPCVD nitride layer 18 of an approximate thickness of 100 nm deposited thereupon. Nitride layer 18 is then patterned by photoresist layer 19 as shown in FIG. 3, to serve as a mask for the n-well implant (shown by the arrows of FIG. 3), in a manner similar to nitride layer 6 described above. Oxide 16 may remain as a passivation layer over the regions into which the implant will occur, since the energy of the n-well implant is high enough to place the dopant into epitaxial layer 14 through oxide 16.

The ion implantation for forming the n-wells in epitaxial layer 14 may be done by a single ion implant operation, or by multiple implants, depending upon the dopant profile desired in the n-well. In this embodiment of the invention, a dual n-well implant is then performed using a low energy phosphorous implant followed by a high-energy phosphorous implant. For example, the first implant may be a dose of 1E12 ions/cm$^2$ at 70 keV, and the second implant may be done at 350 keV with a dose on the order of 1.2E12 ions/cm$^2$. Of course, the n-well implant or implants may be significantly altered from that described herein, depending upon the desired dopant profile. The dual implant is followed by an oxide growth step, performed in a steam atmosphere at 900 degrees Celsius for 30 minutes, resulting in oxide layer 22 having a thickness on the order of 350 nm, covering the regions receiving the n-well implant. Nitride oxidation mask layer 18 is then stripped, and the p-well is implanted, masked by oxide regions 22 overlying the n-well regions 20. The p-well implant is a boron implant, for example having a dose of 1E12 ions/cm$^2$ at 50 keV, and is indicated by the arrows in FIG. 4.

Figure 4:
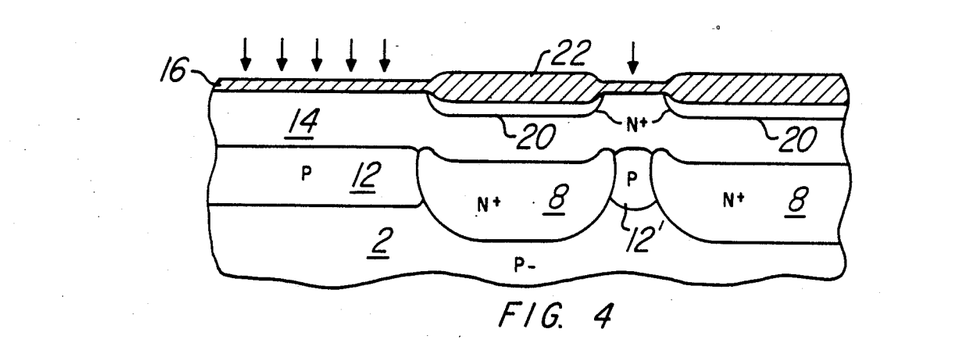

Following the p-well implant, both the n-well and p-well implants are driven to the desired depth. For example, a 150 minute drive in an $N_2/O_2$ environment at 1000 degrees Celsius will typically result in a well depth of approximately 1 micron, for the implant doses and energies described hereinabove. As discussed above, prior BiCMOS fabrication methods utilized n-type epitaxy (for example, on the order of 1 ohm-cm or less), allowing for either omission or dose reduction of the n-well implant. For example, an n-well can be formed into an 0.5 ohm-cm epitaxial layer by way of a single low energy phosphorous implant, in order to minimize the potential of implant damage in the n-well regions (which will eventually contain n-p-n bipolar transistors). However, formation of the p-well in such an epitaxial layer requires counterdoping of the n-type epitaxial layer into p-type. As is well known in the art, this counterdoping degrades the carrier mobility of the resulting layer; since the p-well will be used in the channel region of the n-channel MOS transistors, the performance of the n-channel MOS transistors is accordingly degraded by such counterdoping. As is well known, n-channel transistors in a CMOS device generally have faster switching times than the p-channel transistors, due to the greater carrier mobility in the channel region; CMOS designs thus generally use n-channel MOS transistors as much as possible in speed-critical functions. Accordingly, degradation of carrier mobility in the channel region of the n-channel transistors in a CMOS or BiCMOS circuit will directly impact the performance of the circuit. The use of the intrinsic epitaxial layer 14 according to this embodiment of the invention reduces the mobility degradation in p-well 24 by minimizing the counterdoping required in its formation. Formation of n-well 20 in intrinsic epitaxial layer 14 according to the above-described method has not resulted in noticable implant damage or degradation of the bipolar transistors.

Figure 5:
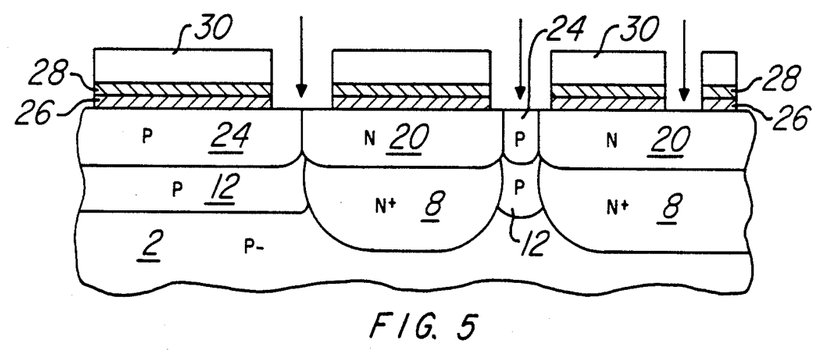

Oxide regions 22 and such oxide as is formed in the drive step are then stripped, leaving the n-well regions 20 and p-well regions 24 as shown in FIG. 5. As in the case of the formation of the buried p-type regions 12, p-well regions 24 are formed self-aligned with n-well regions 20.

This embodiment further includes additional isolation regions between the p-well regions 24 and n-well regions 20. Accordingly, after the oxide regions 22 are etched, a 10 nm layer 26 of silicon dioxide is grown, upon which is deposited a buffer polysilicon layer 28, having a thickness of approximately 50 nm. LPCVD nitride layer 30 is then deposited upon polysilicon 28, and the nitride/polysilicon/oxide sandwich is then patterned to expose the isolation regions. The benefits of polysilicon layer 28 as a buffer in the formation of LOCOS isolation are described in U.S. Pat. No. No. 4,541,167, issued Sept. 17, 1985 and assigned to Texas Instruments Incorporated. After exposure of the isolation regions, a channel-stop is implanted to supplement the p-well boron concentration in p-wells 24 near the surface. This supplementation overcomes the segregation of boron from p-wells 24 into the isolation oxide regions during formation (such formation described below). An example of such an implant is a boron implant of a dose in the range of 3E12 to 5E12 ions/cm$^2$, at an energy on the order of 40 keV. However, it should be noted that portions of n-wells 20 also receive this implant (unless a separate masking step is performed), requiring optimization of the channel-stop implant dose to adequately compensate the boron segregation from p-wells 24 (i.e., to keep the field oxide threshold voltage high in p-wells 24) while avoiding overcompensating the portions of n-wells 20 receiving the implant (i.e., to keep the field oxide threshold voltage high in n-wells 20). A high pressure oxidation step (e.g., 52 minutes in a steam environment at 10 atmospheres pressure and 900 degrees Celsius) is then performed to form the recessed isolation oxide layers 32, such oxidation masked by nitride layer 30 over the active regions of the structure. It should of course be noted that any one of a number of known techniques for forming field oxide layers may be used to form oxide layers 32 (for example, more or less recess may be desirable, the poly buffering may be omitted, or formation of the oxide may occur at a different temperature or at atmospheric pressure); the method described in said U.S. Pat. No. 4,541,167 is preferable, for the reasons described therein.

Figure 6:
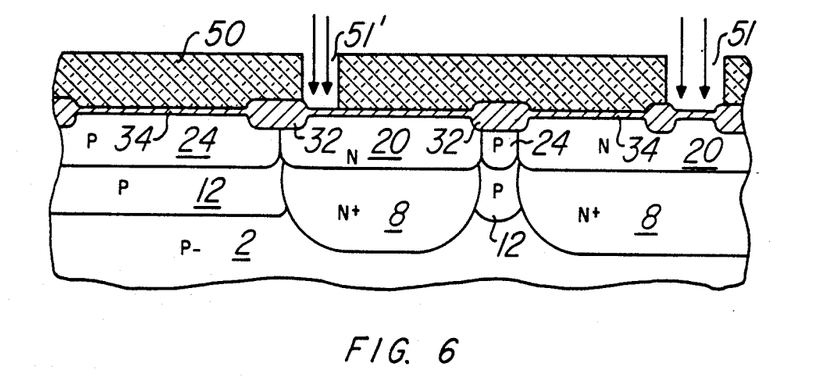

Referring now to FIG. 6, the resultant recessed isolation oxide regions 32 are illustrated. The thickness of oxide regions 32 formed by the above process is preferably at least 700 nm. Nitride layer 30, buffer polysilicon layer 28, and oxide layer 26 are etched according to conventional techniques, clearing the surface of the wafer. A thin pregate oxide, or dummy gate oxide, layer 34 is then grown to a thickness of the order of 20 nm for protection of the silcon surface during subsequent process steps leading up to the formation of the actual gate dielectric.

Figure 7A:
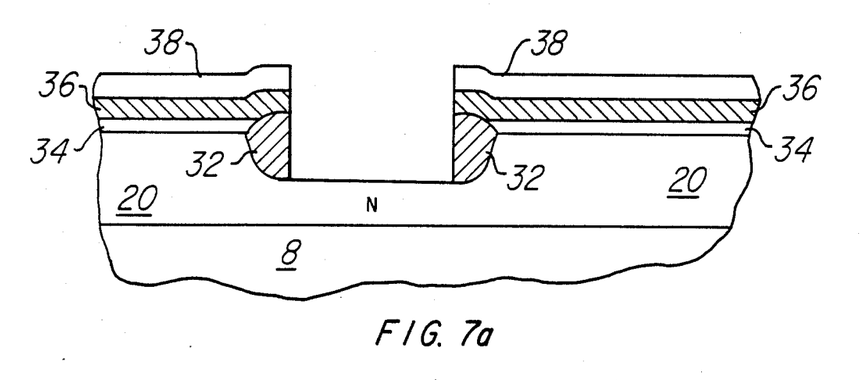
FIGS. 7a through 7e are cross-sectional views of a BiCMOS semiconductor structure illustrating various states of the fabrication of trench isolation, according to an alternate embodiment of the invention.

In operation, p-wells 24 and n-wells 20 will be biased so that the junctions therebetween will be reverse-biased, serving to isolate the wells from one another. Accordingly, a portion of a p-well 24 may be disposed between two n-wells 20 for isolating the two n-wells 20 from one another; an example of the need for such isolation is for isolating an n-well 24 which will contain MOS transistors from an n-well 24 which will contain bipolar transistors. An alternative to such junction isolation between wells is the use of trench isolation. FIGS. 7a through 7e illustrate the formation of such trench isolation into the structure of FIG. 6, used in the example of isolating two n-wells 20 from one another. Such trench isolation is preferable over junction isolation in certain situations, for example, where the additional process cost to form the trenches is outweighed by the added performance from reduced sidewall capacitance (of the trench versus the reverse-biased junctions), or by the savings of wafer surface area of the trench scheme due to tighter packing density allowed by trench isolation. Referring to FIG. 7a, after the growth of oxide layer 34 a buffer layer of polysilicon 36 is deposited by LPCVD to a thickness on the order of 250 nm. A layer of TEOS oxide 38, having a thickness on the order of 1 micron, is then deposited on top of the buffer polysilicon layer 36 to serve as hard mask material for the etch of the trench. Photoresist (not shown) is then used to define the pattern for the trench, after which TEOS oxide 38, polysilicon layer 36, oxide layer 34 and field oxide 32 are etched to expose a portion of n-well 20 through which the isolating trench is to be formed. FIG. 7a shows the result of the formation of the hard trench mask.

Figure 7B:
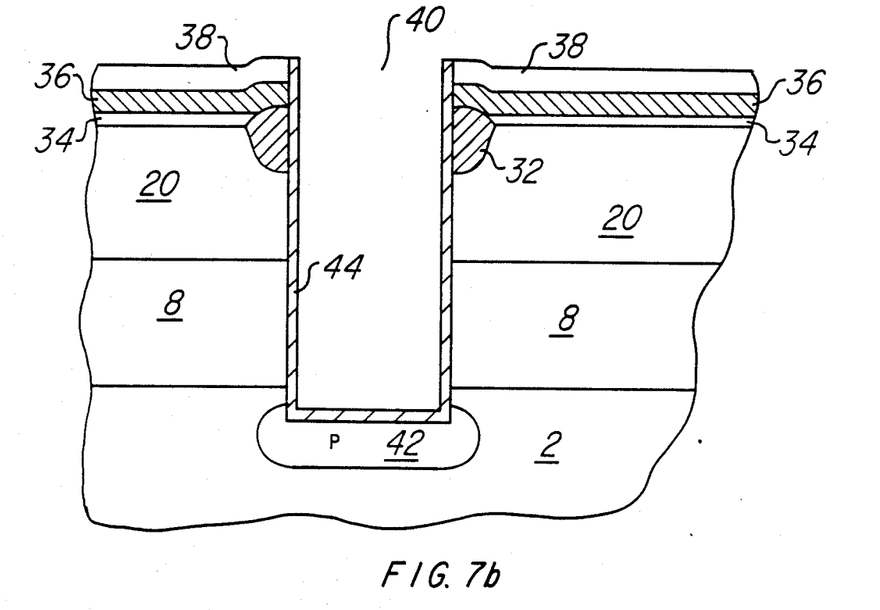

Following the formation of the hard mask, a trench 40 is etched through recessed oxide layer 32 and through n-well 20 by way of reactive ion etch (RIE), according to well known trench etch techniques. The trench is preferably extended beyond the depth of buried n+ region 8 to a depth reaching substrate 2. A first sidewall layer of oxide (not shown) is grown in trench 40, to a thickness of approximately 100 nm, serving in a role similar to a dummy gate oxide. A channel stop implant is performed into the bottom of the trench 40, through the first sidewall oxide, to form channel-stop region 42 thereat. The first sidewall oxide layer is then stripped, and a 100 nm layer 44 of oxide is regrown on the sidewalls and bottom of trench 40, as shown in FIG. 7b.

Figure 7C:
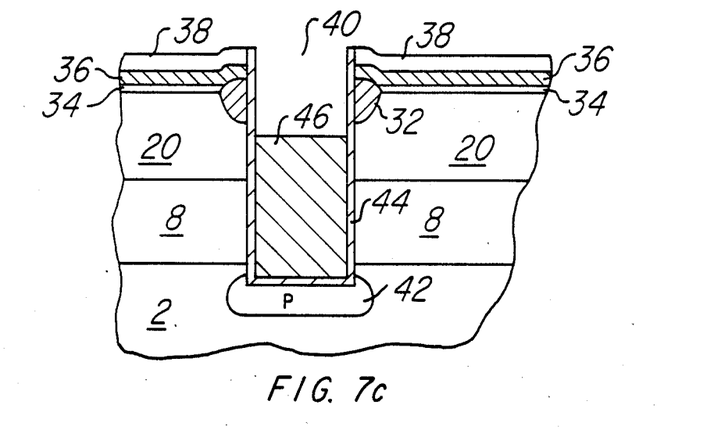
Figure 7D:
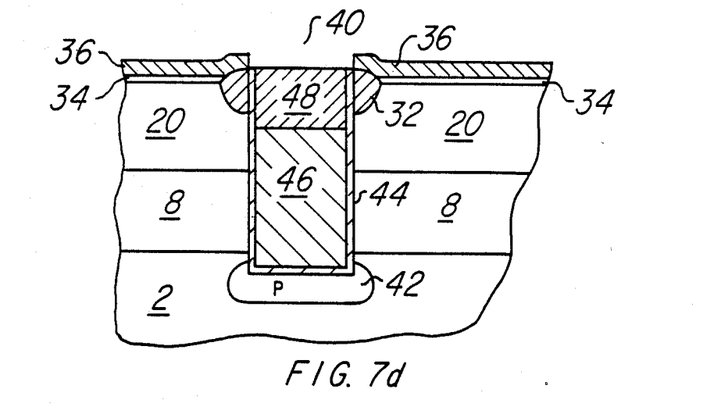

After regrowth of the sidewall oxide layer 44, trench 40 is filled with a polysilicon plug 46, formed by CVD of a polysilicon layer over the entirety of the wafer. A planarization etch of the polysilicon layer is performed until TEOS oxide layer 38 is reached, stopping the etch at the surface of the wafer; the etch is continued so that the polysilicon plug 46 inside trench 40 is recessed to a predetermined depth (e.g., in a range of 0.5 to 1.0 microns), as shown in FIG. 7c.

The formation of the trench isolation is completed by deposition of a second TEOS oxide layer 48 over the entirety of the wafer, filling the recess in trench 40 caused by the overetch of polysilicon plug 46. TEOS oxide layer 48 is then etched back until polysilicon layer 36 is reached at the surface of the wafer away from trench 40, so that TEOS oxide 48 is planarized with the top of recessed oxide layer 34 near the trench, providing the structure of FIG. 7d.

Figure 7E:
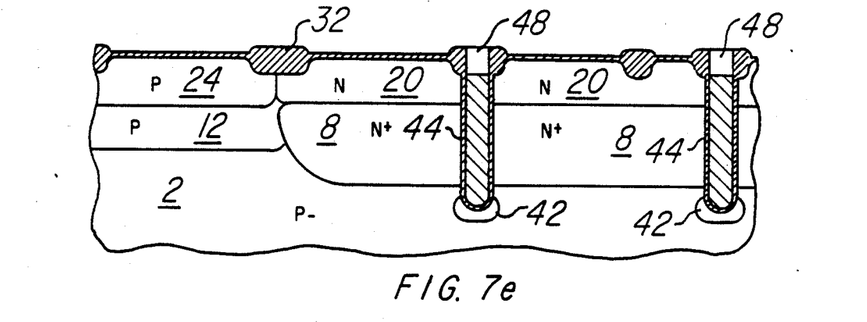

The filling of trench 40 with a polysilicon plug 46 provides a structure which adds minimal stress to the integrated circuit, since polysilicon and single crystal silicon expand and contract at substantially the same rate during temperature cycling. It should be noted that the trench structure resulting from the method described above relative to FIGS. 7a through 7d allows for subsequent metal-to-metal or metal-to-poly contacts to be made directly above trench 40, because the thick oxide within the recess of trench 40 minimizes the risk of overetching the contact via into polysilicon plug 46 and causing leakage thereinto from the overlying layer. Such a structure thus removes the requirement that contacts be spaced away from the top of trench 40, such a requirement often resulting in additional wafer area merely for contact spacing rules to be obeyed. It should further be noted that prior techniques used to oxidize the top of the trench without recessing the polysilicon plug 46 resulted in bird's-beak formation near the surface of the structure, adding stress-induced leakage potential at the silicon-silicon oxide interface at the top of trench 40. The formation of the TEOS oxide cap 48 of FIG. 7d thus provides for a low stress fill of the trench, so that contacts may be made directly thereabove with minimal stress-induced leakage occuring at or near the top of trench 40. FIG. 7e illustrates such trench isolation as incorporated into the structure of FIG. 6.

It should be noted that the trench isolation method described hereinabove relative to FIGS. 7a through 7d is also useful in the fabrications of totally bipolar integrated circuits, for the same reasons as described above. In such an application, field oxide regions 32 would not necessarily be present, requiring only the hard mask provided by oxide layer 38.

As is well known in the art, buried n+ regions 8 are especially suitable for collector electrodes of bipolar transistors. Referring back to FIG. 6, photoresist layer 50 is shown as patterned to expose a portion 51 of n-well region 20 in which bipolar transistors will be formed for an n-type implant (indicated by the arrows of FIG. 6) of the deep collector contact from the surface of n-well region 20 to buried n+ region 8. In addition, a direct contact through n-well 20 to buried n+ region 8 is preferable for n-wells 20 containing MOS transistors, for purposes of reducing latchup susceptibility; accordingly, a portion 51' of another n-well 20 is exposed to receive the deep collector implant. An exemplary deep collector implant is a high energy (on the order of 150 keV) phosphorous implant, with a dose in the range of 5E15 to 2E16 ions/cm$^2$. The resultant deep collector contact 52 is illustrated in FIG. 8.

Figure 8:
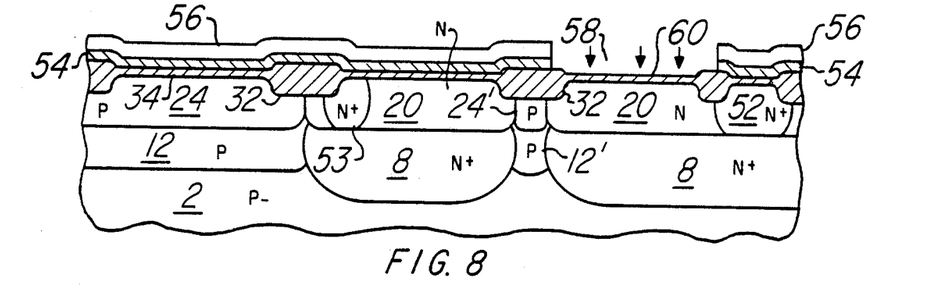

As shown in FIG. 8, photoresist layer 50 is then stripped, prior to definition of the mask layer for formation of the base region of the bipolar transistors. An LPCVD polysilicon layer 54 is first deposited to a thickness on the order of 100 nm to minimize stress-induced defects in a similar fashion as described in the above-referenced U.S. Pat. No. 4,541,167 for poly-buffered LOCOS isolation. The deposition of polysilicon 54 is then followed by the deposition of LPCVD nitride layer 56, to a thickness on the order of 270 nm. Nitride layer 56 and polysilicon layer 54 are then patterned and etched to define the base area at location 58 in the structure of FIG. 8.

Once base area 58 is defined by the patterning and etching of layers 54 and 56 as shown in FIG. 8, a relatively thick oxide layer 60, for example, from 60 to 150 thick, is grown over base area 58. Due to the presence of nitride layer 56, no such oxide 60 is of course grown other than the exposed base area 58. The growth of oxide layer 60 is followed by the boron implant to form the diffused base of the bipolar transistor, such an implant indicated in FIG. 8 by the arrows. An exemplary base implant through the thick oxide 60 is a boron implant of a dose of 8E13 ions/cm$^2$, at an energy of 80 keV. The thicknesses of pregate oxide 34, polysilicon layer 54 and nitride layer 56 are selected to block the base implant; the above described thicknesses (e.g., 20 nm, 100 nm, and 270 nm, respectively), are noted to be effective to block the above-described base implant. The above implant is effective to form the base region through an oxide layer 60 grown to a thickness of 140 nm. The advantages of the thick oxide layer 60 through which the base implant is made, will be described in further detail hereinbelow. This base implant results in base region 61 shown in FIG. 9, extending to a depth approximately in the range of 300 to 400 nm from the surface. It should of course be noted that subsequent processing will reduce oxide layer 60 to a final thickness within a range from 40 to 130 nm, depending upon its thickness as grown.

Figure 9:
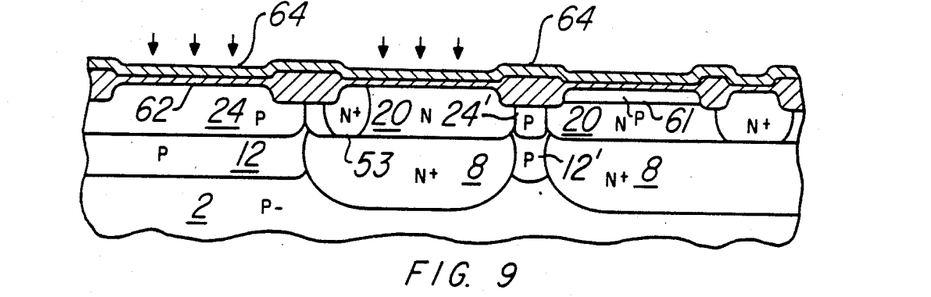

Subsequent to the base implant, nitride layer 56 is cleared by a wet etch, polysilicon layer 54 is removed by a plasma etch, and pregate ("dummy gate") oxide 34 is removed by another wet etch. Referring to FIG. 9, gate oxide 62, serving as the gate dielectric for the MOS transistors and, as will be described below, in the patterning of diffused resistors, is then grown to the desired thickness, for example on the order of 20 nm. A preferred method for growth of gate oxide 62 is dry/steam/dry sequence at a temperature of 850 degrees Celsius; for purposes of the instant invention, however, any well known technique may of course be used for growth of the gate oxide 62, including the use of other dielectric materials or combination of materials. A buffer polysilicon layer 64 is then deposited by way of LPCVD to a thickness on the order of 125 nm. As is well known in the art, a threshold voltage adjust ion implant may be done at this time to adjust the threshold voltages of the MOS transistors according to the desired circuit operation. Such an implant (indicated by the arrows in FIG. 9) is masked only by the recessed isolation oxide layers 32, and is generally a p-type implant of relatively low (50 keV) energy. Alternatively, the threshold adjust implant may be done through pregate oxide 34, prior to the growth of gate oxide 62.

Figure 10:
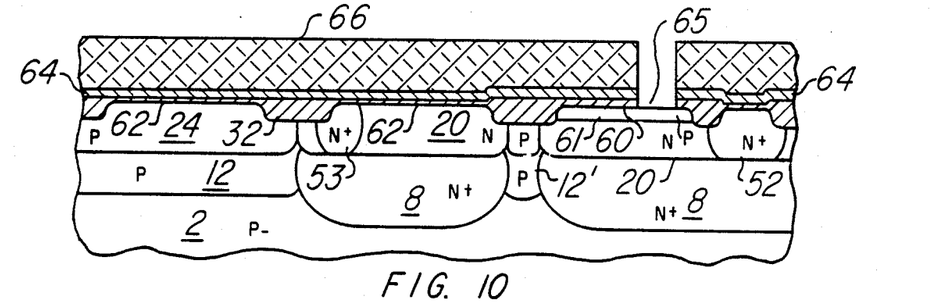
Figure 11:
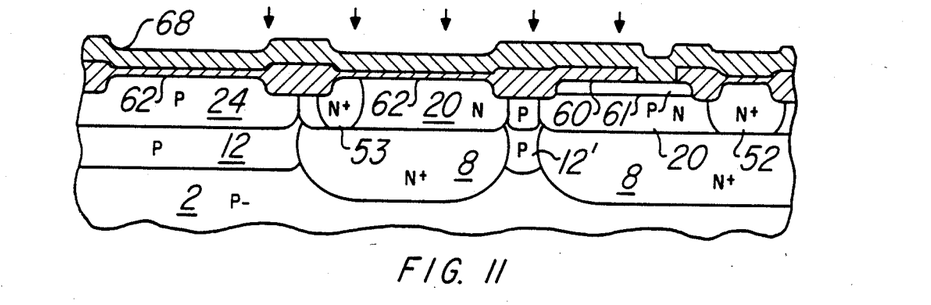

Referring now to FIG. 10, a layer of photoresist 66 is shown disposed above the surface of the wafer, patterned to define the location of the emitter for the bipolar transistor. Polysilicon layer 64 and oxide layer 60 above base region 61 are then etched to expose the location 65 of the emitter contact to base region 61. After exposing the emitter contact, photoresist 66 is stripped, and a layer of polysilicon 68 is deposited by LPCVD over the surface of the wafer, contacting base region 61 in the emitter contact area as shown in FIG. 11. Polysilicon layer 68 is deposited to a thickness of 325 nm, and will serve as the gate electrode for the MOS transistors, and as an interconnect level, if desired. Polysilicon layer 68 will also serve as the source of the dopant for diffusion of the emitter region into base region 61 of the bipolar transistor, as described below. Polysilicon layer 68 is additive to polysilicon layer 64 at locations not in the emitter contact, resulting in thicker polysilicon at those locations. Polysilicon layer 68 is then doped by way of a phosphorous implant of a dose on the order of 1E16 to 2E16 ions/cm$^2$ at an energy of 50 keV, as indicated by the arrows in FIG. 11.

Figure 12:
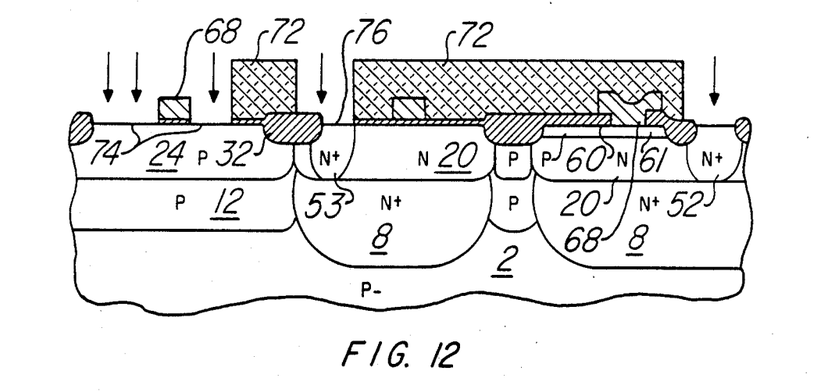

Referring now to FIG. 12, polysilicon layer 68 is shown after being patterned and etched for the formation of the gate electrodes for the MOS transistors and the emitter contact for the bipolar transistor. Subsequent to the polysilicon etch, a layer of TEOS oxide (not shown) may be deposited (e.g., of 30 nm) to passivate the silicon surface and to minimize ion channeling into the source and drain regions during subsequent implant steps; this thin layer of TEOS oxide will also serve to offset the reach-through implant from the polysilicon gate electrode 68, compensating for lateral diffusion of the reach-through implant for better alignment with the edges of gate electrode 68. Photoresist layer 72 is patterned to define the source and drain regions 74 for the n-channel MOS transistor, and for defining the n-well contact 76 to be implanted by a phosphorous reach-through implant (indicated by the arrows in FIG. 12). Collector contact 52 and buried n+ region contact 53 also can receive this implant. The reach-through implant is intended to form the shallow and relatively lightly-doped n-type diffusion in the formation of an n-channel MOS transistor having a "lightly-doped-drain" (or graded junction), as described in U.S. Pat. No. 4,566,175 issued Jan. 28, 1987 and assigned to Texas Instruments Incorporated. An example of such a reach-through implant is a dose on the order of 2E13 ions/cm$^2$ at an energy of 80 keV.

Figure 13:
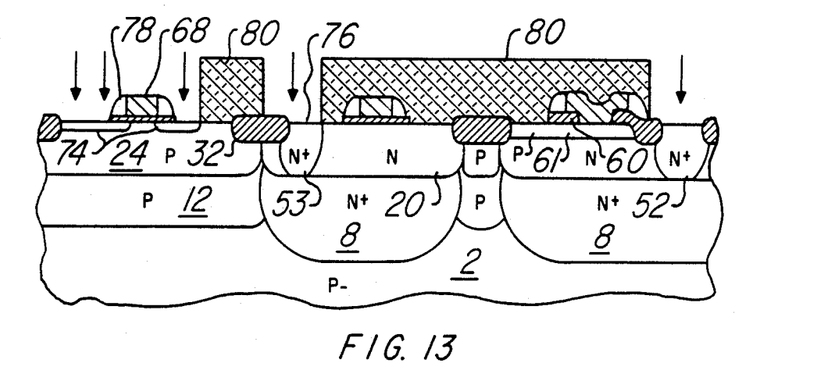

FIG. 13 illustrates the formation of sidewall oxide filaments 78 on each side of the polysilicon 68. Such formation is accomplished by stripping photoresist 72 (from FIG. 12), depositing a conformal layer of TEOS oxide over the wafer (in this example, approximately 200 nm thick), and then anisotropically etching the oxide layer as described in said U.S. Pat. No. 4,566,175, leaving the sidewall filaments 78 shown in FIG. 13. Thick oxide 60 is also etched at the locations not covered by the emitter polysilicon 68 and sidewall filaments 78. An additional layer of TEOS oxide (not shown) may be deposited as before for passivation of the surface and for reduction of ion channeling during implant, and photoresist 80 is patterned to again expose the n-channel source and drain regions 74, n-well contact 76, and collector contact 52. The source/drain implant is now performed, forming the deeper junction depth for the heavily-doped source and drain of the n-channel MOS transistor; an example of such a source/drain implant (indicated by the arrows in FIG. 13) is a high energy arsenic implant (e.g., at 150 keV) having a dose of 3E15 ions/cm$^2$, followed by a lower energy phosphorous implant (e.g., at 95 keV) having a dose on the order of 4E14 ions/cm$^2$.

Figure 14:
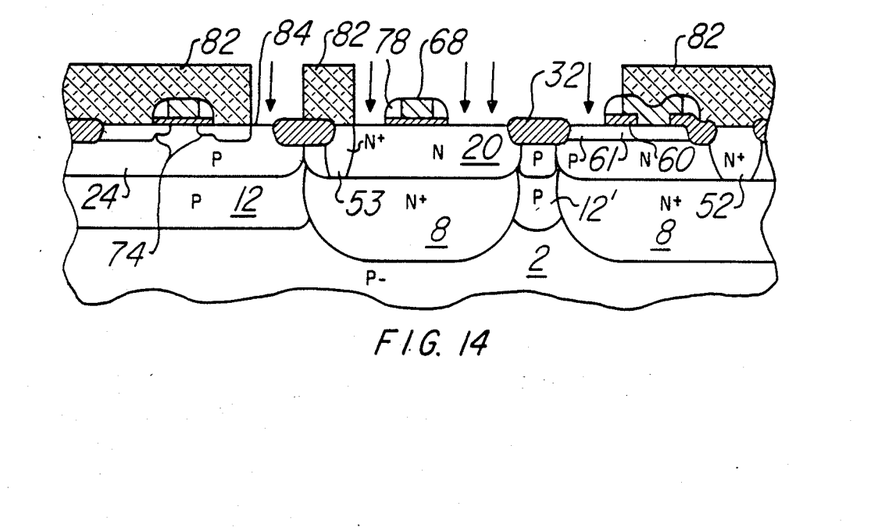

FIG. 14 illustrates the formed source and drain regions 74 of the n-channel MOS transistor in p-well 24, as well as the n+ contact 76 in n-well 20. Photoresist 80 is stripped, and a photoresist pattern 82 is formed to define the source-drain regions 84 for the p-channel MOS transistor in n-well 20, as well as p+ contact 85 in p-well 24 and p+ base electrode contact 86 to base region 61. The boron source-drain implant is indicated by the arrows in FIG. 14, for example, having a dose of 3E5 ions/cm$^2$ at an energy of 20 keV.

Figure 15A:
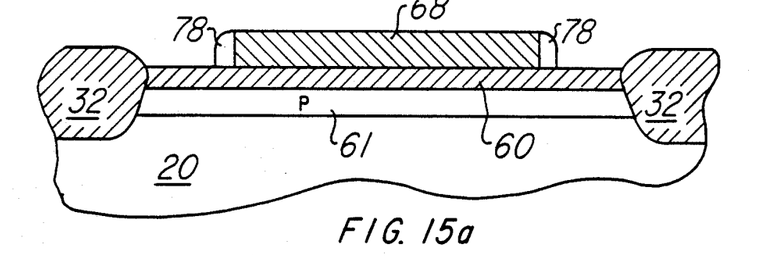
FIGS. 15a and 15b are cross-sectional views of a diffused resistor in various states of fabrication, according to the process of the invention.
Figure 15B:
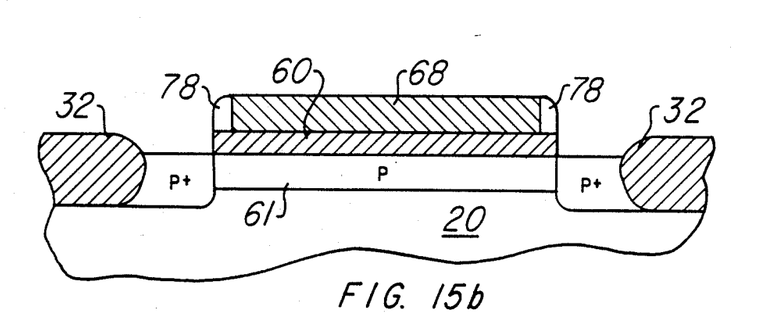

Referring now to FIGS. 15a and 15b, the formation of a diffused resistor according to the invention is illustrated. As shown in FIG. 15a, the diffused resistor exists in a region receiving the same base implant through oxide layer 60, as shown in FIG. 8 (i.e., region 61 of FIG. 15a). Deposition and patterning of polysilicon (gate electrode) 68, and formation of sidewall oxide filaments 78 are then performed as described above. This results in the structure of FIG. 15a, with polysilicon electrode 68 and sidewall oxide filaments 78 lying above oxide layer 60 over base region 61. Electrical contact is made to the ends of region 61 by patterning and clearing portions of oxide layer 60 outside of the sidewall oxide filaments, and by subjecting the exposed portions to the p+ source/drain implant described above relative to FIG. 14, resulting in the structure of FIG. 15b. Connection may then be made to the p+ diffusions 88 by any of a number of known techniques. It should be noted that the polysilicon 68 and sidewall filaments 78 will prevent region 61 from becoming silicided (as described hereinbelow), allowing the resistance of the diffused resistor to be defined by the geometry and doping concentration of base region 61.

Figure 16:
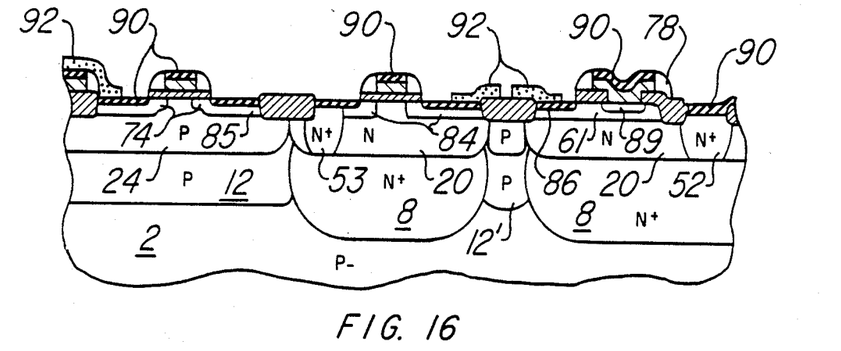

Referring now to FIG. 16, after the completion of both the p and n source/drain implants shown in FIG. 14, the implanted dopants are driven by a high temperature anneal in an inert atmosphere, such as a 30 minute anneal at 900 degrees Celsius in an argon atmosphere. This anneal not only drives the source/drain implants, but also causes the dopant in polysilicon 68 to diffuse into base region 61, forming emitter region 89 therein, as described in copending application Ser. No. 932,752 filed Nov. 19, 1986 and also assigned to Texas Instruments Incorporated. The emitter junction depth from such a process is in the range of 100 to 150 nm; the anneal also pushes the depth of base region 61 to a certain extent under the emitter (i.e., "emitter push"). After this source/drain and emitter anneal, any remaining oxide is cleaned from the source, drain and contact regions into which the source/drain implants were made, as well as polysilicon 68. The diffusions may then be silicide-clad if desired, by deposition of a metal such as titanium for a direct reaction with the exposed silicon, followed by an oxide cap, as described in U.S. Pat. No. 4,690,730 issued Sept. 1, 1987, assigned to Texas Instruments Incorporated. The result is the formation of titanium silicide layers 90 shown in FIG. 17. As described in U.S. Pat. No. 4,675,073, issued June 23, 1987 and assigned to Texas Instruments Incorporated, local interconnections 92 may subsequently be made by patterning and etching the unreacted titanium on the silicide and oxide layers, and by exposing the patterned titanium film to a nitrogen atmosphere.

Figure 17:
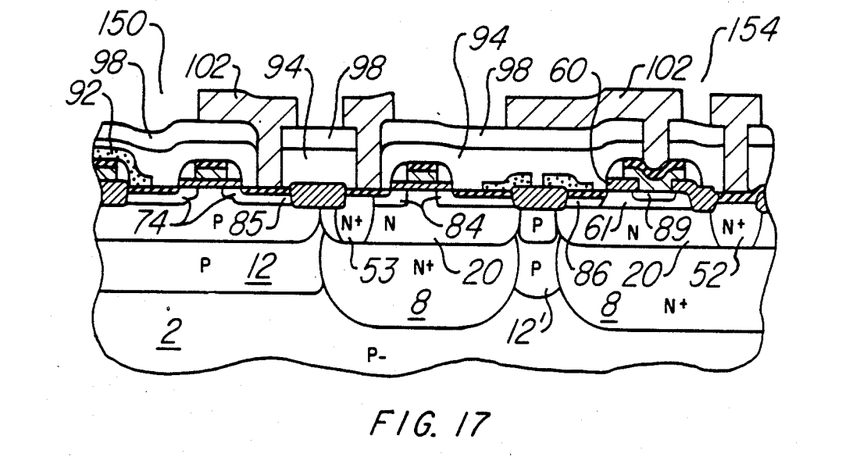

Referring now to FIG. 17, the first level of metal interconnect is illustrated as connected to the various locations within the fabricated structure. A multilevel dielectric is formed of a relatively thick (on the order of 1 micron) first layer 94 of LPCVD TEOS oxide. Layer 94 is then planarized and etched back as described in copending application Ser. No. 010,937, filed Feb. 5, 1987 and assigned to Texas Instruments Incorporated.

The planarized TEOS oxide 94 is then coated with a second TEOS oxide layer (e.g., approximately 100 nm thick), followed by a layer of phosphorous doped oxide 98, having a thickness on the order of 300 nm and a phosphorous concentration of 5% by weight. Contact vias are patterned and etched, and the phosphorous-doped oxide 98 is activated and densified by a high temperature anneal, for example 60 minutes at 700 degrees Celsius. A first level metallization 102 may then be deposited to make contact to the various locations in the structure, and may consist of a standard aluminum, or doped aluminum metallization, or of a first layer of titanium tungsten alloy followed by a layer of CVD tungsten. The Ti/W-tungsten system is especially useful in multi-level metal systems; an additional level of metal interconnect may of course be added to the structure of FIG. 18, making contacts to first metallization 102 through vias formed according to known techniques.

It should be noted that the thick oxide layer 60 underlying the portion of polysilicon 68 which forms the emitter for the bipolar transistor acheives certain benefits. First, the emitter polysilicon 68 is separated from base region 61 by a greater distance due to the thicker oxide layer 60, reducing the capacitance between the emitter electrode and base region 61, improving the switching speed of the bipolar transistor. In addition, it can be seen that the first metal contact to the emitter electrode is made directly over diffused emitter region 89 in base region 61, saving the surface area required for the formation of the bipolar transistors, as well as reducing the emitter resistance by reducing the length of the current path in the emitter electrode. In prior circuits such stacking of the contact resulted in reliability degradation due to leakage from emitter electrode to base region caused by stressing of the thin dielectric therebetween.

Figure 18:
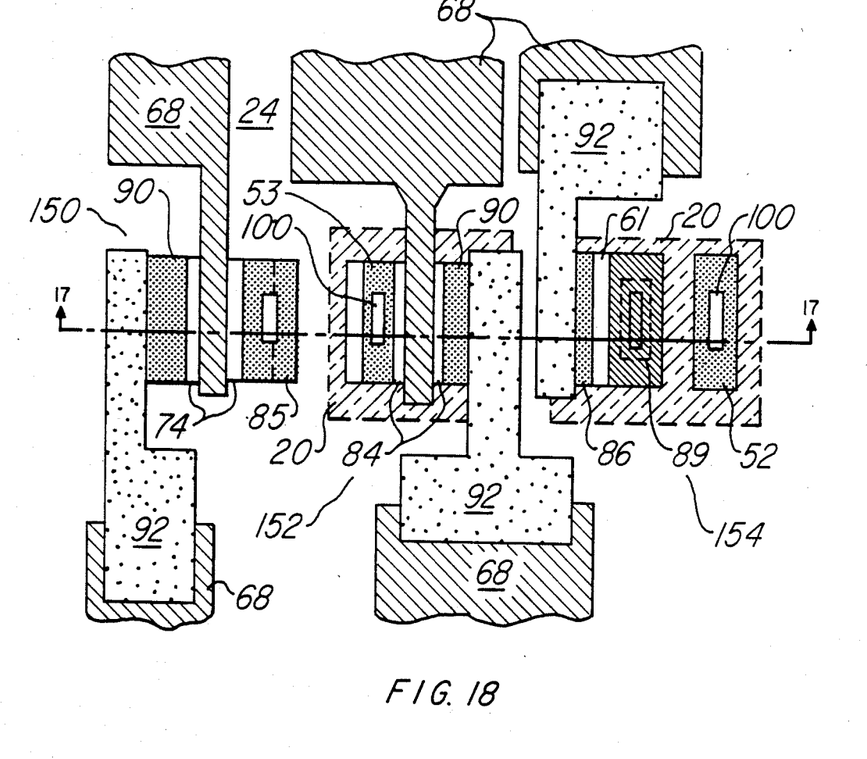
FIG. 18 is a plan view of the structure of FIG. 17.

After the first level metallization illustrated in FIG. 18, the presence of the two channel-conductivity MOS transistors, well connections, and a bipolar transistor can be easily seen as fabricated into the single substrate 2. N-channel transistor 150 is shown as fabricated into p-well 20 at the left side of FIG. 18, having its source region and well contact connected to ground through first level metal 102, and having its drain region contacted by local interconnection layer 92. The p-channel transistor 152 is similarly biased, with its source and well contact connected to the $V_{dd}$ power supply, and its drain region contacted by patterned local interconnect 92. For operation as a CMOS inverter, the gate and drain electrodes of transistors 150 and 152 would be connected together. Bipolar transistor 154 formed into the n-well 20 at the right side of FIG. 18 has a subcollector in buried n+ region 8, contacted by first level metal 102 through deep collector contact 52. The emitter region 89 is also contacted by patterned first level metal 102, while base region 61 is contacted by patterned local interconnect layer 92.

Referring now to FIG. 18, a plan view is shown of the structure of FIG. 17 with metal layer 102 not shown for purposes of clarity. Contact vias 100 are shown in FIG. 18, indicating the etched locations of layers 94 and 98 for metal-to-poly and metal-to-diffusion contacts. In this embodiment, n-wells 20 appear as islands in a single p-well 24. Local interconnects 92 are shown to overlap onto polysilicon layers 68, for connection to other locations of the integrated circuit.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. Such changes and additional embodiments will of course include variations on the implant conditions, oxidation and diffusion cycles, and metallization systems described herein. It is contemplated that all such changes and additional embodiments are within the spirit and true scope of the invention as claimed below.

We claim:

1. An integrated circuit structure formed into a semiconductor body, comprising:
   an MOS transistor body, comprising:
   a source region of a first conductivity type diffused into said semiconductor body;
   a drain region of said first conductivity type diffused into said semiconductor body;
   a gate dielectric overlying a channel region disposed between said source and drain regions; and
   a gate electrode, comprising doped polycrystalline silicon and overlying said gate dielectric; and
   a bipolar transistor, comprising:
   a collector region of a second conductivity type disposed within said semiconductor body at a distance away from said MOS transistor;
   a base region of said first conductivity type disposed within said collector region;
   an emitter region of said second conductivity type disposed within said base region;
   a base dielectric in contact with said base and emitter regions, the thickness of said base dielectric being greater than the thickness of said gate dielectric of said MOS transistor;
   an emitter electrode comprising doped polycrystalline silicon and in contact with said base dielectric, and making contact to said emitter region through a contact via formed through said base dielectric; and
   a base contact region of said first conductivity type disposed within said base region, said base contact region having substantially the same depth as said source and drain regions of said MOS transistor and being self-aligned to said emitter electrode; and
   wherein the portion of said emitter electrode in contact with said base dielectric has substantially the same thickness and conductivity as said gate electrode.

2. The structure of claim 1, wherein said emitter region is formed by diffusion of dopant from said emitter electrode through the contact via formed through said base dielectric.

3. The structure of claim 1, further comprising:
   an insulating dielectric, overlying said base and emitter regions; and
   a metallization layer, overlying said insulating dielectric and making contact to said emitter electrode through a contact via through said insulating dielectric.

4. The structure of claim 24, wherein said contact via through said insulating dielectric overlies said emitter region.

5. The structure of claim 1, further comprising:

a diffused resistor, comprising:
- a diffused region formed into said semiconductor body at a distance away from said bipolar and MOS transistors;
- a resistor dielectric overlying said diffused region, sad resistor dielectric of a thickness approximately the same as that of said base dielectric;
- a polysilicon layer, having substantially the same thickness and conductivity as said gate electrode and overlying sad resistor dielectric; and
- contact diffusions, formed at opposing ends of said diffused region.

6. An integrated circuit structure formed in a semiconductor body, comprising:
an MOS transistor, comprising:
- a source region diffused into said semiconductor body;
- a drain region diffused into said semiconductor body;
- a gate dielectric overlying a channel region disposed between said source and drain regions; and
- a gate electrode, comprising polysilicon and overlying said gate dielectric; and a diffused resistor, comprising:
- a diffused region formed into said semiconductor body at a distance away from said MOS transistor;
- a resistor dielectric overlying said diffused region, said resistor dielectric of a thickness greater than the thickness of said gate dielectric;
- a polysilicon layer, having substantially the same thickness and conductivity as said gate electrode and overlying said resistor dielectric; and
- contact diffusions, formed at opposing ends of said diffused region and self-aligned with said polysilicon layer.

7. The structure of claim 1, wherein said channel region and said diffused region are of a first conductivity type.

8. The structure of claim 1, further comprising:
- an isolation dielectric disposed adjacent said base contact region; and
- an interconnect disposed upon the surface of said base contact region and extending onto said isolation dielectric, said interconnect comprising a conductive compound of a refractory metal.

9. An integrated circuit structure formed into a semiconductor body, comprising:
an MOS transistor, comprising:
- a source region of a first conductivity type diffused into said semiconductor body;
- a drain region of said first conductivity type diffused into said semiconductor body;
- a gate dielectric overlying a channel region disposed between said source and drain regions; and
- a gate electrode, comprising doped polycrystalline silicon and overlying said gate dielectric; and a bipolar transistor, comprising:
- a collector region of a second conductivity type disposed within said semiconductor body at a distance away from said MOS transistor;
- a base region of said first conductivity type disposed within said collector region;
- an emitter region of said second conductivity type disposed within said base region;
- a base dielectric overlying said base and emitter regions, the thickness of said base dielectric being greater than the thickness of said gate dielectric of said MOS transistor;
- an emitter electrode comprising doped polycrystalline silicon and overlying said base dielectric, and making contact to said emitter region through a contact via formed through said base dielectric, the portion of said emitter electrode overlying said base dielectric having substantially the same thickness and conductivity as said gate electrode;
- a base contact region of said first conductivity type disposed within said base region, said base contact region having substantially the same depth as said source and drain regions of said MOS transistor and being self-aligned to said emitter electrode;
- an isolation dielectric disposed adjacent said base contact region; and
- an interconnect disposed upon the surface of said base contact region and extending onto said isolation dielectric, said interconnect comprising titanium nitride.

10. The structure of claim 1, further comprising:
a metal silicide film disposed at the surface of said base contact region.

11. The structure of claim 10, further comprising:
- an isolation dielectric disposed adjacent said base contact region; and
- an interconnect disposed upon the surface of said metal silicide film, and extending onto said isolation dielectric, said interconnect comprising a conductive compound of a refractory metal.

* * * * *